United States Patent

Tauchi

[11] Patent Number: 5,936,192
[45] Date of Patent: Aug. 10, 1999

[54] MULTI-STAGE ELECTRONIC COOLING DEVICE

[75] Inventor: Hitoshi Tauchi, Kariya, Japan

[73] Assignee: Aisin Seiki Kabushiki Kaisha, Kariya, Japan

[21] Appl. No.: 08/992,096

[22] Filed: Dec. 17, 1997

[51] Int. Cl.$^6$ ..................................................... H01L 35/28
[52] U.S. Cl. .......................................... 136/203; 136/204
[58] Field of Search ..................................... 136/203, 204

[56] References Cited

U.S. PATENT DOCUMENTS

| | | | |
|---|---|---|---|
| 3,136,134 | 6/1964 | Smith | 136/203 |
| 3,615,870 | 10/1971 | Crouthamel | 136/204 |
| 4,922,822 | 5/1990 | Bierschenk et al. | 136/204 |
| 5,430,322 | 7/1995 | Koyanagi et al. | 136/203 |

FOREIGN PATENT DOCUMENTS 2-10781  1/1990  Japan .

*Primary Examiner*—Kathryn Gorgos
*Assistant Examiner*—Thomas H. Parsons
*Attorney, Agent, or Firm*—Oblon, Spivak, McClelland, Maier & Neustadt, P.C.

[57] ABSTRACT

A multi-stage electronic cooling device has an electrically insulating base plate, a first thermoelectric converter portion having the Peltier effect and disposed on one surface of the electrically insulating base plate, and a second thermoelectric converter portion having the Peltier effect and disposed on another surface of the electrically insulating base plate. A through hole is formed in the electrically insulating base plate. An electrically conductive member interconnects the first thermoelectric converter portion and the second thermoelectric converter portion via an interior of the through hole. In an optional construction, the electrically conductive member is formed of an electrically conductive coating formed on the inner peripheral surface of the through hole, and the first and second thermoelectric converter portions are disposed between the electrically insulating base plate and two additional insulating base plates at opposite sides thereof

19 Claims, 5 Drawing Sheets

MULTI-STAGE ELECTRONIC COOLING DEVICE

The entire disclosure of Japanese Patent Application No. Hei 08-341139 filed on Dec. 20, 1996, including the specification, drawings and abstract, is incorporated herein by reference in its entirety.

BACKGROUND OF THE INVENTION

1. Field of the invention

The present invention relates to an electronic cooling device using temperature reduction caused by the Peltier effect and, more particularly, to a multi-stage electronic cooling device wherein Peltier-effect thermoelectric elements are arranged on a plurality of stages.

2. Description of the Related Art

A multi-stage electronic cooling device having a two or more-stage construction as shown in FIG. 9 is disclosed in Japanese patent application laid-open No. Hei 2-10781. The cooling device has six stages, on each of which thermoelectric couples A, each formed of an n-type semiconductor 21 and a p-type semiconductor 22, are disposed so that n-type semiconductors 21 and p-type semiconductors 22 are alternately arranged. The thermoelectric couples A are connected in series by electrodes formed on base plates 23. When a current is passed through the thermoelectric couples A on each stage, an upper-side base plate portion gives off heat and is cooled, so that the uppermost base plate 23a is cooled to a low temperature.

In the conventional multi-stage electronic cooling device, there is a need to electrically connect the electrodes on different stages. Although a method of connecting the electrodes on different stages is not specifically described in any literature known to the present inventors, methods as illustrated in FIGS. 10 and 11 can be considered. In the method shown in FIG. 10, end electrodes of different stages are connected by lead wires that are soldered to the electrodes. In the method shown in FIG. 11, end electrodes of difference stages are connected by plates of copper, which is a good electrical conductor. The copper plates are soldered to the electrodes.

However, if the method shown in FIG. 10 is employed, the lead wires considerably protrude from sides of the electronic cooling device, resulting in an increased total size. This drawback is significant since the electronic cooling device is normally required to have a compact body. If the method shown in FIG. 11 is employed, cracks are likely to occur in bent portions of the copper plates. Such cracks impede stable current through the electronic cooling device, causing a reduction in product reliability. Furthermore, in either of the methods shown in FIGS. 10 and 11, if the chip height of the thermoelectric semiconductors is reduced, the clearance between the base plates and the connecting parts, such as lead wires, copper plates or the like, becomes very small, making it very difficult or impossible to solder the connecting parts. If soldering is possible, the soldering operation will be complicated.

SUMMARY OF THE INVENTION

Accordingly, it is an object of the invention to provide a multi-stage electronic cooling device having a compact structure, improved reliability and good operability.

According to one aspect of the invention, there is provided a multi-stage electronic cooling device including an electrically insulating base plate, a first thermoelectric converter portion having the Peltier effect and disposed on one surface of the electrically insulating base plate, and a second thermoelectric converter portion having the Peltier effect and disposed on another surface of the electrically insulating base plate. A through hole is formed in the electrically insulating base plate. An electrically conductive member interconnects the first thermoelectric converter portion and the second thermoelectric converter portion through the interior of the through hole.

The multi-stage electronic cooling device of the invention operates as follows. When a current flows through, for example, the first thermoelectric converter portion, heat absorption occurs at one side of the first thermoelectric portion so that this side portion becomes relatively warm, and heat dissipation occurs at the other side of the first thermoelectric portions so that this other side portion is relatively cooled, due to the Peltier effect. The current is conducted from the first thermoelectric converter portion on one side of the electrically insulating base plate to the second thermoelectric converter portion on the other side of the electrically insulating base plate through the through hole, by the electrically conductive member. In the second thermoelectric converter portion, due to the Peltier effect, one side of the second thermoelectric converter portion absorbs heat and becomes relatively warm, and the other side gives off heat and is relatively cooled.

A feature of the invention is the electrically conductive member for interconnecting the first and second thermoelectric converter portions disposed on the two surfaces of the electrically insulating base plate through the through hole. With this construction for conducting electricity from one stage to another, the multi-stage electronic cooling device of the invention eliminates the need to use lead wires which take up inconveniently large spaces, or copper plates which are likely to crack and therefore degrade reliability, or other disadvantageous electricity-conducting devices.

According to the invention, the electrically conductive member may include an electrically conductive coating formed at least on an inner peripheral surface of the through hole. The electrically conductive coating may be formed from an electrically conductive plated coating, an electrically conductive high-temperature baking-type coating material and/or an electrically conductive low-temperature baking-type coating material.

If an electrically conductive plated coating is used to form the electrically conductive coating, it becomes possible to simultaneously form an electrode pattern on the electrically insulating base plate and the electrically conductive coating on the inner peripheral surface of the through hole in a single plating process. The plated coating includes, for example, a copper-plated coating, a nickel-plated coating, a zinc-plated coating, a silver-plated coating or a gold-plated coating.

If the electrically conductive coating is formed from an electrically conductive high-temperature baking-type coating material, it becomes possible to form the electrically conductive coating on the inner peripheral surface of the through hole even if plating of the electrically insulating base plate is not possible. The electrically conductive high-temperature baking-type coating material includes, for example, a high-temperature baking-type coating material containing silver and platinum as main components, and a high-temperature baking-type coating material containing silver and palladium as main components.

If the electrically conductive coating is formed from an electrically conductive low-temperature baking-type coating material, it becomes possible to form the electrically conductive coating on the inner peripheral surface of the through hole even if the electrically insulating base plate is neither compatible with plating nor highly heat resistant. The electrically conductive low-temperature baking-type coating material includes, for example, a low-temperature baking-type coating material containing silver and an epoxy resin as main components, a low-temperature baking-type coating material containing, as main components, silver and a liquid-type resin that hardens depending on temperature, and a low-temperature baking-type coating material containing copper and a resin as main components.

The multi-stage electronic cooling device may further include at least two electrically insulating base plates disposed at opposite sides of the electrically insulating base plate so that the first thermoelectric converter portion and the second thermoelectric converter portion are separately sandwiched between two neighboring electrically insulating base plates of at least three electrically insulating base plates.

Each of the first thermoelectric converter portion and the second thermoelectric converter portion separately sandwiched between two neighboring electrically insulating base plates may include at least one n-type thermoelectric element, at least one p-type thermoelectric element and at least one electrode electrically interconnecting the at least one n-type thermoelectric element and the at least one p-type thermoelectric element. The at least one n-type thermoelectric element and the at least one p-type thermoelectric element may be alternately arranged.

Furthermore, the multi-stage electronic cooling device may have at least one electrode patterned and fixed to the electrically insulating base plates. At least one n-type thermoelectric element and at least one p-type thermoelectric element alternately arranged are disposed on the at least one electrode. The at least one n-type thermoelectric element electrically interconnects, in series, a p-type thermoelectric element and an n-type thermoelectric element that neighbor each other.

The electrically conductive member and the at least one electrode may be formed from the same material.

The electrically conductive member may electrically connect an electrode on which a p-type thermoelectric element of the first thermoelectric converter portion is disposed to an electrode on which an n-type thermoelectric element of the second thermoelectric converter portion is disposed. The electrodes electrically connected by the electrically conductive member may be located at an end portion of the electrically insulating base plate.

According to another aspect of the invention, there is provided a multi-stage electronic cooling device including a plurality of electrically insulating base plates disposed in a layered arrangement, and a plurality of thermoelectric converter portions having the Peltier effect and disposed between neighboring electrically insulating base plates of the plurality of electrically insulating base plates. A through hole is formed in at least one electrically insulating base plate of the plurality of electrically insulating base plates which carries thermoelectric converter portions formed on opposite surfaces thereof, the opposite surfaces of the at least one electrically insulating base plate facing adjacent electrically insulating base plates. Through an interior of the through hole, an electrically conductive member interconnects neighboring thermoelectric converter portions disposed on the opposite surfaces of the electrically insulating base plate having the through hole.

According to still another aspect of the invention, there is provided a multi-stage electronic cooling device including a first electrically insulating base plate, a second electrically insulating base plate, a third electrically insulating base plate, a first thermoelectric converter portion having the Peltier effect and disposed between the first electrically insulating base plate and the second electrically insulating base plate, and a second thermoelectric converter portion having the Peltier effect and disposed between the second electrically insulating base plate and the third electrically insulating base plate. A through hole is formed in the second electrically insulating base plate. An electrically conductive member interconnects the first thermoelectric converter portion and the second thermoelectric converter portion through an interior of the through hole.

BRIEF DESCRIPTION OF THE DRAWINGS

The foregoing and further objects, features and advantages of the present invention will become apparent from the following description of preferred embodiments with reference to the accompanying drawings, wherein like numerals are used to represent like elements and wherein.

DETAILED DESCRIPTION OF PREFERRED EMBODIMENTS

Preferred embodiments of the present invention will be described in detail hereinafter with reference to the accompanying drawings.

FIRST EMBODIMENT

Figure 1:
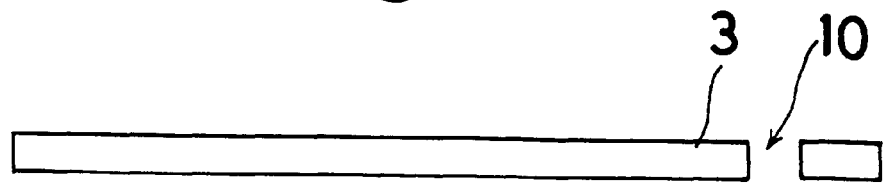
FIG. 1 illustrates a process for production of a two-stage electronic cooling device according to a first embodiment of the invention.
Figure 2:
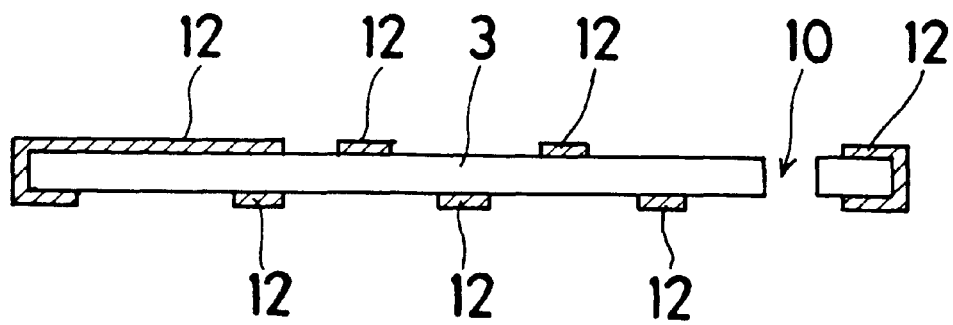
FIG. 2 illustrates a subsequent process for production of the two-stage electronic cooling device of the first embodiment.
Figure 3:
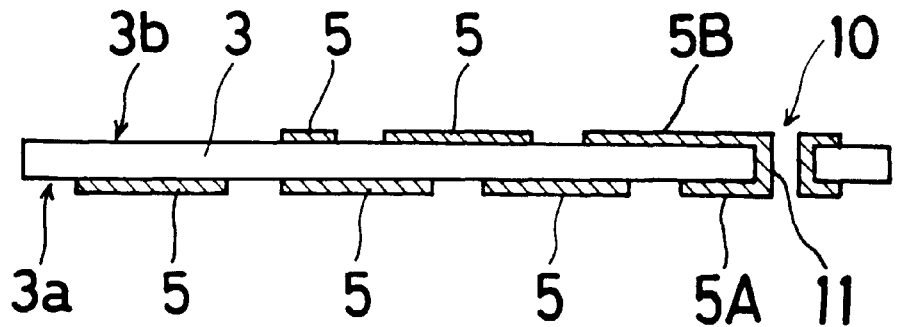
FIG. 3 illustrates a subsequent process for production of the two-stage electronic cooling device of the first embodiment.
Figure 4:
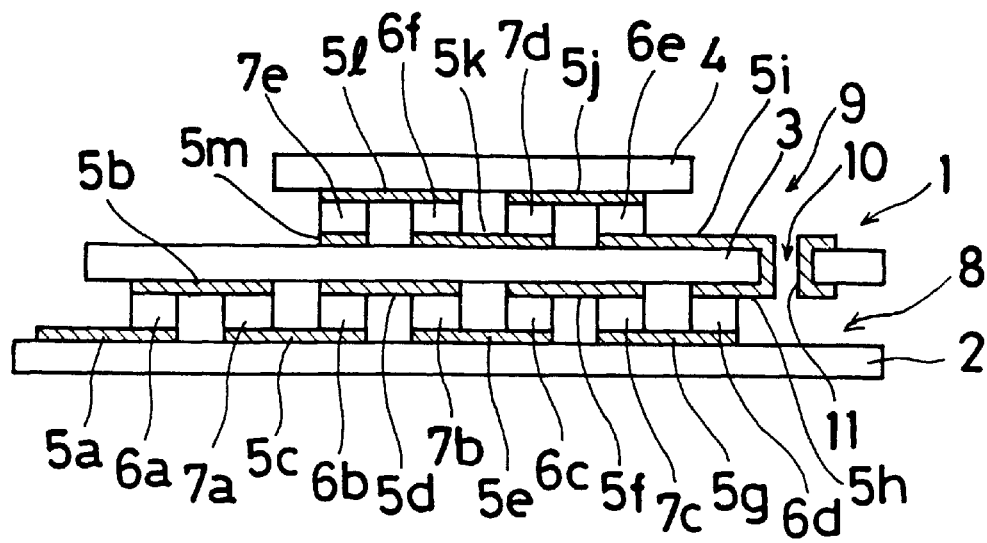
FIG. 4 shows portions of the two-stage electronic cooling device of the first embodiment.

FIG. 4 shows portions of a two-stage electronic cooling device according to the first embodiment of the invention. FIGS. 1 through 3 illustrate a procedure of producing the two-stage electronic cooling device shown in FIG. 4. The structure of the two-stage electronic cooling device of this embodiment will be described-with reference to FIG. 4.

A two-stage electronic cooling device 1 has a first electrically insulating base plate 2, a second electrically insulating base plate 3 and a third electrically insulating base plate 4. Patterned copper electrodes 5a, 5c, 5e, 5g are fixed to an upper surface of the first electrically insulating base plated (top surface thereof in FIG. 4). Patterned copper electrodes 5b, 5d, 5f 5h are fixed to a lower surface of the second electrically insulating base plate 3, and patterned copper electrodes 5i, 5k, 5m are fixed to an upper surface of the second electrically insulating tease plate 3. Patterned copper electrodes 5j, 5l are fixed to a lower surface of the third electrically insulating base plate 4.

Disposed between the first and second electrically insulating base plates 2 and 3 are n-type thermoelectric elements 6a, 6b, 6c, 6d and p-type thermoelectric elements 7a, 7b, 7c. The n-type and p-type thermoelectric elements are alternately arranged. Likewise, n-type thermoelectric elements 6e, 6f and p-type thermoelectric elements 7d, 7e are alternately arranged between the second and third electrically insulating base plates 3 and 4.

Neighboring thermoelectric elements are electrically interconnected by the electrodes. More specifically, the n-type and p-type thermoelectric elements are connected in by intervening electrodes. For example, between the first electrically insulating base plate 2 and the second electrically insulating base plate 3, n-type and p-type thermoelectric elements and intervening electrodes are connected in series in the order of electrode 5a/n-type thermoelectric element 6a/electrode 5b/p-type thermoelectric element 7a/electrode 5c/n-type thermoelectric element 6b/electrode 5d/p-type thermoelectric element 7b/. . . . The connecting members (the electrodes 5a–5h, the n-type thermoelectric elements 6a–6d, and the p-type thermoelectric elements 7a–7c) arranged between the first and second electrically insulating base plates 2 and 3 form a first stage thermoelectric converter portion 8. Likewise, the connecting members between the second and third electrically insulating base plates 3 and 4 (that is, the electrodes 5i–5m, the n-type thermoelectric elements 6e, 6f, and the p-type thermoelectric elements 7d, 7e) form a second-stage thermoelectric converter portion 9.

A through hole 10 is formed in a portion of the second electrically insulating base plate 3. An inner peripheral surface of the through hole 10 is coated with an electrically conductive coating 11. The electrically conductive coating 11 is formed from the same copper as that of the electrodes. The electrically conductive coating 11 electrically connects the electrode 5h disposed in a right hand-end portion (in FIG. 4) of the first-stage thermoelectric converter portion 8, and is directly connected to the n-type thermoelectric element 6d, to the electrode 5i disposed in a right hand-end portion (in FIG. 4) of the second-stage thermoelectric converter portion 9 and directly connected to the n-type thermoelectric element 6e.

Thus, the two-stage electronic cooling device 1 of this embodiment includes the second electrically insulating base plate 3, the thermoelectric elements 6a–6f, 7a–7e arranged on the opposite surfaces of the second electrically insulating base plate 3, the through hole 10 formed in the second electrically insulating base plate 3, and the electrically conductive coating 11 formed inside the through hole 10 to interconnect a thermoelectric element (the n-type thermoelectric element 6d) disposed on one surface of the second electrically insulating base plate 3 and a thermoelectric element (the n-type thermoelectric element 6e) disposed on the other surface of the second electrically insulating base plate 3.

The operation of the two-stage electronic cooling device 1 will now be described.

When a current is caused to flow from the electrode 5a disposed at the left end (in FIG. 4) of the first-stage thermoelectric converter portion 8, the current flows alternately through the n-type thermoelectric elements and the p-type thermoelectric elements of the first-stage thermoelectric converter portion 8 intervened by electrodes, that is, in the order of the n-type thermoelectric element 6a, the electrode 5b, the p-type thermoelectric element 7a, the electrode 5c, the n-type thermoelectric element 6b, . . . Due to the Peltier effect, the side of the electrodes (electrodes 5a, 5c, 5e, 5g) fixed to the first electrically insulating base plate 2 absorbs heat and becomes warm, and the side of the electrodes (electrodes 5b, 5d, 5f, 5h) fixed to the second electrically insulating base plate 3 gives off heat and is cooled. The current further flows from the electrode 5h at the right end (FIG. 4) of the first-stage thermoelectric converter portion 8 to the electrode 5i at the right end of the second-stage thermoelectric converter portion 9, through the copper-made electrically conductive coating 11 fixed to the inner peripheral surface of the through hole 10. The current from the electrode 5i flows alternately through the n-type and p-type thermoelectric elements of the second-stage thermoelectric converter portion 9 intervened by electrodes, that is, in the order of the n-type thermoelectric element 6e, the electrode 5j, the p-type thermoelectric element 7d, the electrode 5k, the n-type thermoelectric element 6f, . . . Due to the Peltier effect, the electrodes (electrodes 5i, 5k, 5m) fixed to the second electrically insulating case plate 3 absorb heat from the thermoelectric elements and become relatively warm, and the electrodes (5j, 5l) fixed to the third electrically insulating base plate 4 give off heat and are cooled.

In the two-stage electronic cooling device 1 of the first embodiment, electric conduction from the first-stage thermoelectric converter portion 8 to the second-stage thermoelectric converter portion 9 is achieved by the electrically conductive coating 11 formed on the inner peripheral surface of the through hole 10 formed in the second electrically insulating base plate 3. Thus, the embodiment achieves electrical connection of different stages without using lead wires, copper plates or the like. Therefore, the embodiment eliminates the problems of a size increase due to protruding lead wires or the like, a reduction in reliability, and degradation in operability.

FIGS. 1 through 3 illustrate a method of producing an electrically insulating base plate carrying electrodes and electrically conductive coatings fixed thereto. This production method will be described.

First, a through hole 10 is formed in an electrically insulating base plate 3 formed from an alumina ceramic, as shown in FIG. 1. Subsequently, a plating resist 12 is formed on portions of the opposite surfaces of the electrically insulating base plate 3, that is, portions other than the portions on which electrodes are to be formed. The inner peripheral surface of the through hole 10 and surrounding portions thereof are not coated with the plating resist 12 as shown in FIG. 2.

The electrically insulating base plate 3 having the plating resist 12 is subjected to a copper-plating process, thereby forming electrodes 5 as shown in FIG. 3. Since the inner peripheral surface of the through hole 10 and surrounding portions thereof are not coated with the plating resist 12, these surfaces are also coated with copper so that the electrically conductive coating 11 is formed on the inner peripheral surface of the through hole 10. As can be seen in FIG. 3, the electrode 5A formed on one surface 3a of the electrically insulating base plate 3 and the electrode 5B formed on the other surface 3b are interconnected by the electrically conductive coating 11 deposited on the inner peripheral surface of the through hole 10. After that, n-type and p-type thermoelectric elements are disposed at predetermined positions on the thus-produced electrically insulating base plates carrying the electrodes and the electrically conductive coatings, and the base plate units are stacked on top of one another, to form a multi-stage electronic cooling device.

Since the electrodes 5 and the electrically conductive coating 11 are formed from the same material by the same processing method (plating process), the formation of electrodes and the formation of an electrically conductive coating can be performed in a single processing step. Therefore, this embodiment reduces production costs. Although the multi-stage electronic cooling device and its production method described above employ copper-plating, it should be understood that plating with other electrically conductive materials may also be employed, achieving substantially the same advantages as achieved by the first embodiment. Such plating includes, for example, nickel-plating, zinc-plating, silver-plating, and gold-plating.

SECOND EMBODIMENT

The second embodiment of the invention is distinguished from the first embodiment in the electrically conductive coating. Whereas the electrically conductive coating 11 in the first embodiment is formed from the same copper material as that of the electrodes, the electrically conductive coating in the second embodiment is formed from a high-temperature baking-type coating material containing silver and palladium as main components. Since the overall construction of the multi-stage electronic cooling device of the second embodiment is substantially the same as in the first embodiment shown in FIG. 4, only the process of forming an electrically conductive coating on an electrically insulating base plate according to the second embodiment will be described below.

Figure 5:
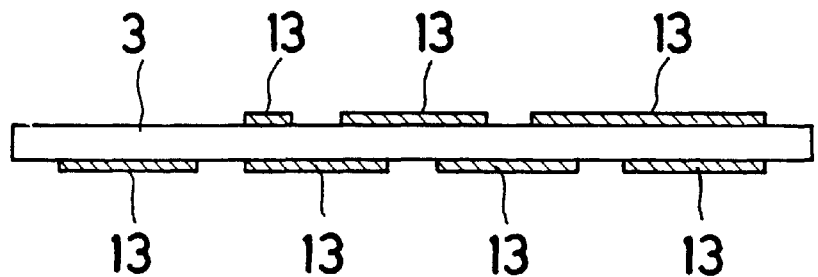
FIG. 5 illustrates a process for production of a two-stage electronic cooling device according to a second embodiment of the invention.
Figure 6:
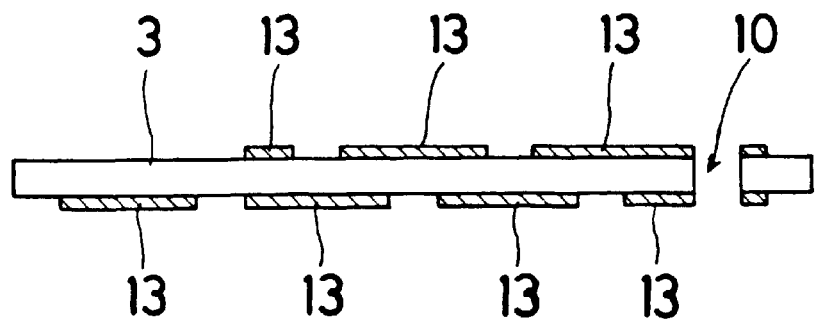
FIG. 6 illustrates a subsequent process for production of the two-stage electronic cooling device of the second embodiment.
Figure 7:
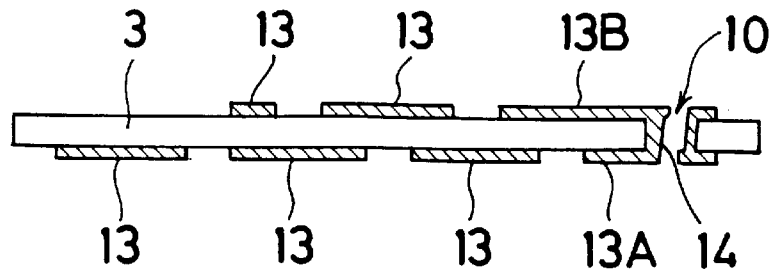
FIG. 7 illustrates a subsequent process for production of the two-stage electronic cooling device of the second embodiment.

FIG. 5 through 7 illustrate the process of forming an electrically conductive coating (high-temperature baking type coating material) on an electrically insulating base plate.

First, as shown in FIG. 5, a high-temperature baking-type coating material containing silver and palladium as main components is applied to an electrically insulating base plate 3 formed from barium titanate, by screen printing. By baking the applied material, electrodes 13 are formed on opposite surfaces of the electrically insulating base plate 3. In this coating process, the high-temperature baking-type coating material is also applied to opposite surfaces of a portion of the electrically insulating base plate 3 where a through hole 10 is to be formed, and the applied coating material is baked.

Subsequently, a through hole 10 is formed, by laser, at a predetermined position in the electrically insulating base plate 3 whose opposite surfaces have been coated with the high-temperature baking-type coating material by screen printing, as shown in FIG. 6. After that, the high-temperature baking-type coating material is applied to the inner peripheral surface of the through hole 10 using an ejector and then baked, thereby forming an electrically conductive coating 14 on the inner peripheral surface of the through hole 10 as shown in FIG. 17. An electrode 13A and an electrode 13B are thus electrically connected by the electrically conductive coating 14 as shown in FIG. 7.

Although not described in detail, the first electrically insulating base plate 2 and the third electrically insulating base plate 4 as shown in FIG. 4 are processed substantially in the same manner as described above, except that a through hole is not formed. That is, an electrode pattern is formed on a surface of each base plate in substantially the same manner as described above. After that, n-type and p-type thermoelectric elements are alternately arranged between the first and second electrically insulating base plates 2 and 3 and between the second and third electrically insulating base plates 3 and 4, to form a two-stage electronic cooling device.

In this embodiment, an electrically conductive coating is formed on the inner peripheral surface of the through hole of the electrically insulating base plate by applying thereto a high-temperature baking-type coating material. Therefore, even if plating of the inner peripheral surface of a through hole of a base plate is not possible, for example, if the base plate is formed of barium titanate, an electrically conductive coating can be formed on the inner peripheral surface of the through hole by the coating process according to the second embodiment. The coating process according to the second embodiment may also be used for a base plate that allows plating processes, for example, the base plate used in the first embodiment.

Since the high-temperature baking-type coating material used in the second embodiment contains silver and palladium as main components, the conductivity of the electrically conductive coating is excellent. Examples of other high-temperature baking-type coating materials with excellent conductivity include a high-temperature baking-type coating material containing silver and platinum as main components.

THIRD EMBODIMENT

Similar to the second embodiment, the third embodiment is distinguished from the first embodiment in the electrically conductive coating. Whereas the electrically conductive coating 11 in the first embodiment is formed from the same copper material as that of the electrodes, the electrically conductive coating in the third embodiment is formed from a low-temperature baking-type coating material containing silver and an epoxy resin as main components. Since the overall construction of the multi-stage electronic cooling device of the third embodiment is substantially the same as in the first embodiment shown in FIG. 4, only an electrically insulating base plate in the third embodiment, on which electrodes and an electrically conductive coating have been formed, will be described with reference to FIG. 8.

Figure 8:
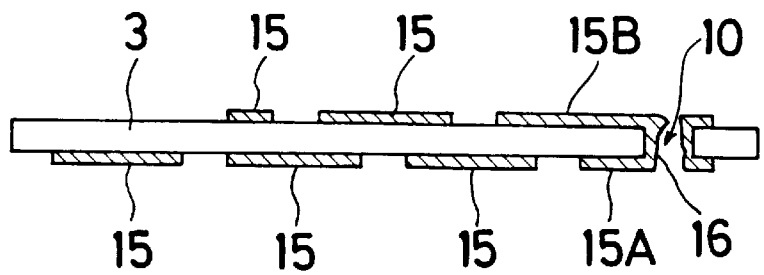
FIG. 8 illustrates a process for production of a two-stage electronic cooling device according to a third embodiment of the invention.
Figure 9:
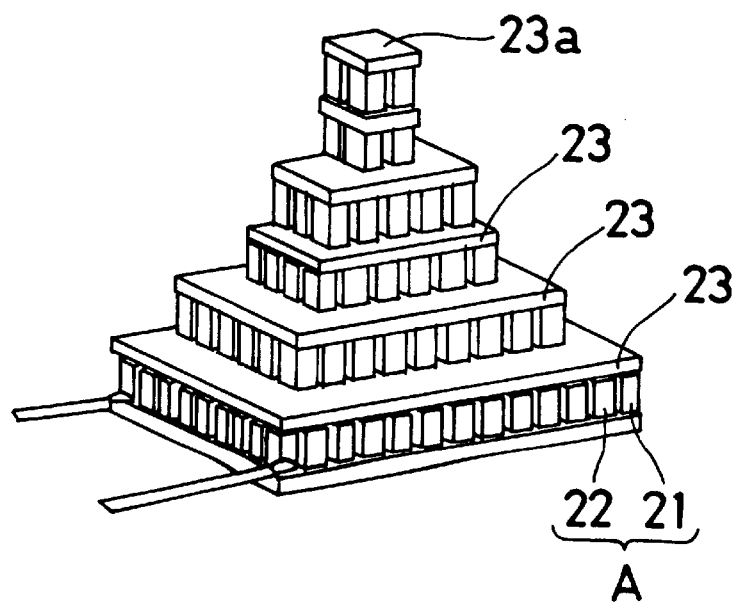
FIG. 9 shows a conventional multi-stage electronic cooling device.
Figure 10:
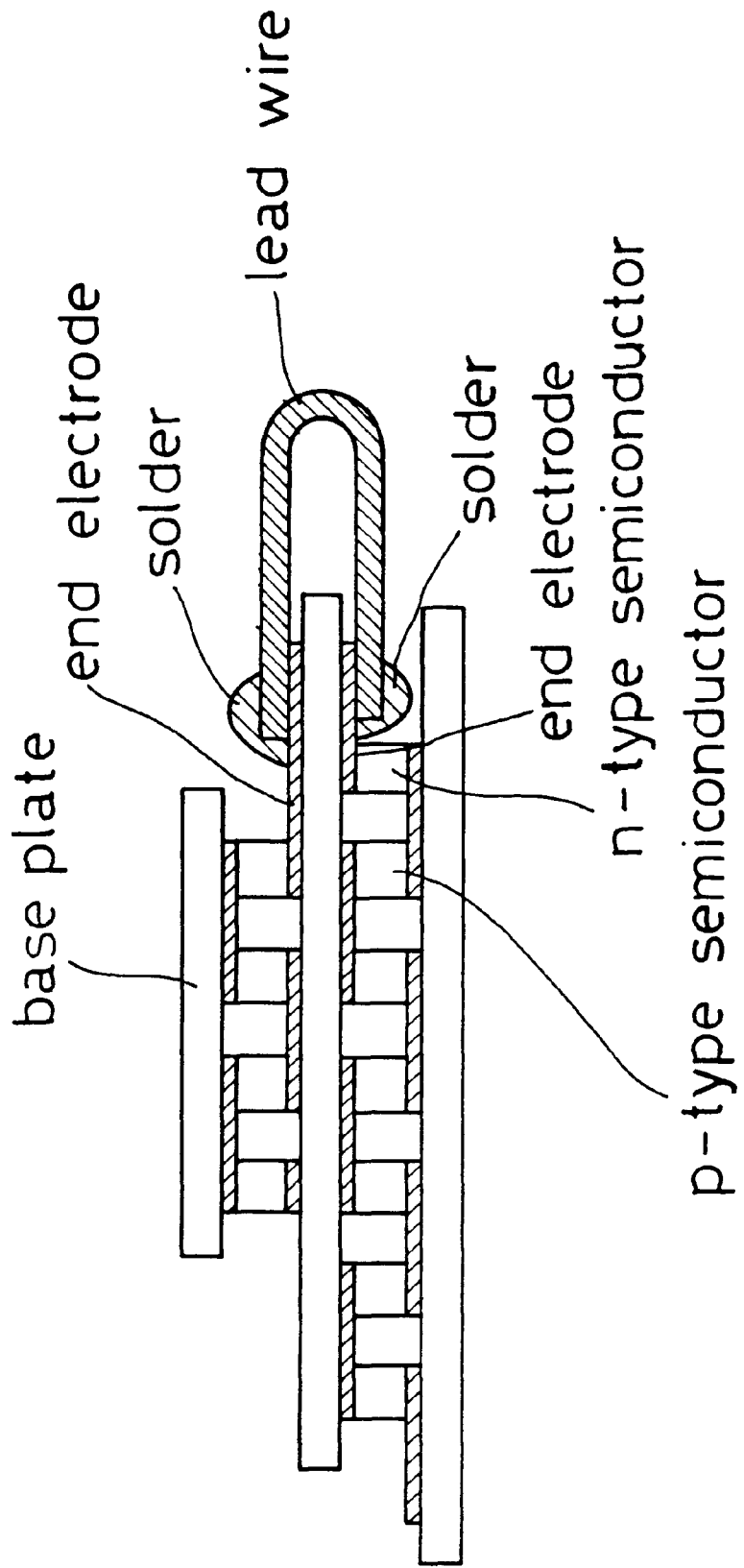
FIG. 10 illustrates a problem of a possible multi-stage electronic cooling device.
Figure 11:
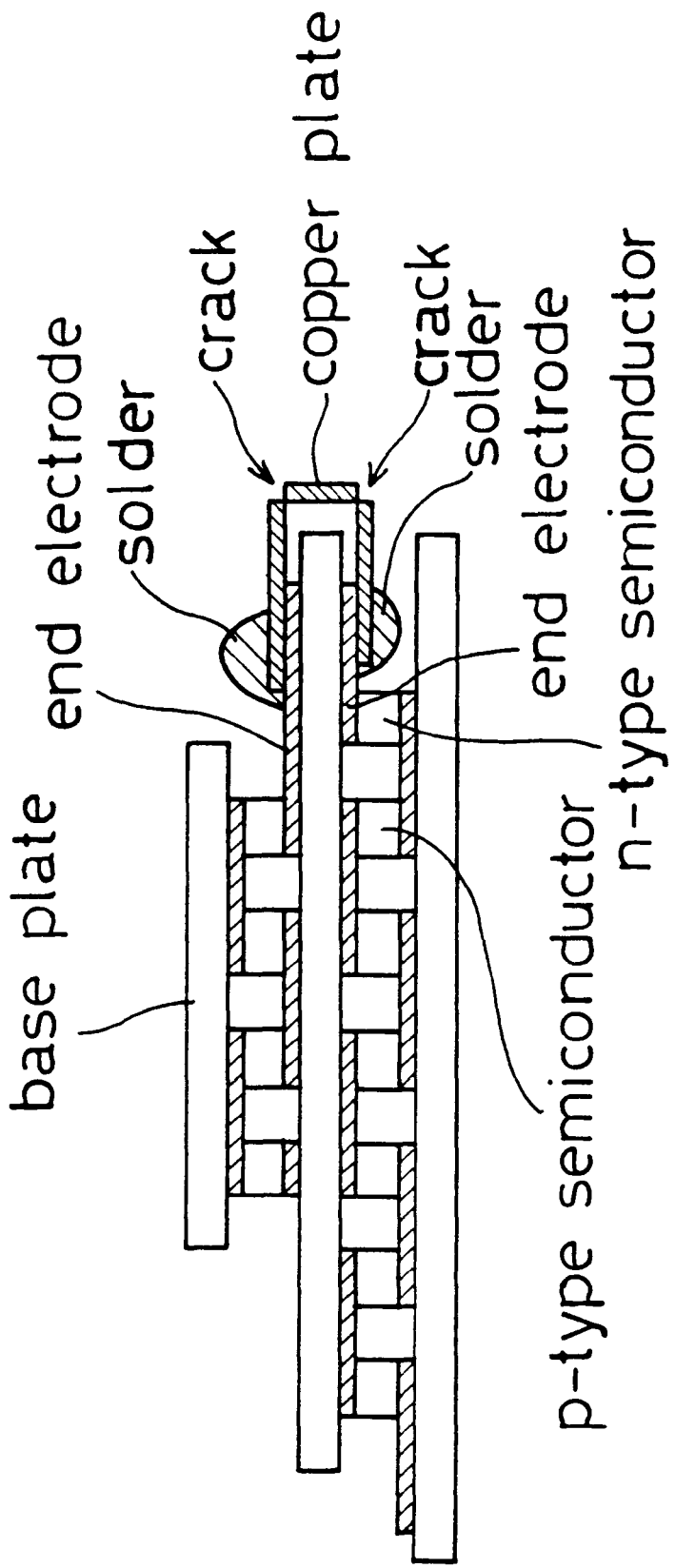
FIG. 11 illustrates a problem of another possible multi-stage electronic cooling device.

FIG. 8 shows an electrically insulating base plate in the third embodiment on which an electrically conductive coating (low-temperature backing-type coating material) and electrodes are formed. A low-temperature baking-type coating material containing silver and an epoxy resin as main components is applied, by screen printing, to surfaces of an alumina ceramic electrically insulating base plate 3 that has a through hole 10, thereby forming electrodes 15. During the screen-printing process to form the electrodes 15, the coating material penetrates into the through hole 10 so that the inner peripheral surface of the through hole 10 is coated with the low-temperature baking-type coating material, thereby forming an electrically conductive coating 16. An electrode 15A on the lower surface (FIG. 8) of the electrically insulating base plate 3 and an electrode 15B on the upper surface are electrically interconnected by the electrically conductive coating 16.

Although not described in detail, the first electrically insulating base plate 2 and the third electrically insulating base plate 4 as shown in FIG. 4 are processed substantially in the same manner as described above, except that the base plates do not have a through hole. That is, an electrode pattern is formed on a surface of each base plate in substantially the same manner as described above. After that, n-type and p-type thermoelectric elements are alternately arranged between the first and second electrically insulating base plates 2 and 3 and between the second and third electrically insulating base plates 3 and 4, to form a two-stage electronic cooling device.

In the third embodiment, the electrically conductive coating is formed on the inner peripheral surface of the through hole of the electrically insulating base plate from the low-temperature baking-type coating material. Therefore, even if the base plate is poor in heat resistance and does not allow plating, for example if the base plate is formed from a plastic, it is possible to form an electrically conductive coating on the inner peripheral surface of a through hole of the base plate.

Although, in the third embodiment, the electrodes and the electrically conductive coating are formed from a low-temperature baking-type coating material containing silver and an epoxy resin as main components, the resin contained in the low-temperature baking-type coating material is not limited to epoxy resin. Any resin may be used as long as it is in a liquid state at a normal temperature and hardens depending on temperature.

According to the invention, the electrically conductive member interconnects the first and second thermoelectric converter portions disposed on two surfaces of the electrically insulating base plate, via the through hole. With this construction for conducting electricity from one stage to another, the multi-stage electronic cooling device of the invention eliminates the need for lead wires which take up large spaces, copper plates which are likely to crack and therefore degrade reliability, or other electricity-conducting devices. Therefore, the invention achieves a size reduction of the multi-stage electronic cooling device, an improvement in product reliability, and an improvement in operability in production.

If the electrically insulating member is formed of an electrically conductive coating formed on the inner peripheral surface of the through hole, and the electrically conductive coating is formed from an electrically conductive plated coating, it becomes possible to simultaneously form an electrode pattern on the electrically insulating base plate and the electrically conductive coating on the inner peripheral surface of the through hole in a single plating process, thereby leading to a reduction of the number and time of production processes and, therefore, to a production cost reduction. Furthermore, since a high electrical conductivity is achieved by plating, it is possible to pass a large current through the multi-stage electronic cooling device and, therefore, increase the cooling capacity of the device.

If the electrically conductive coating is formed from an electrically conductive high-temperature baking-type coating material, it becomes possible to form the electrically conductive coating on the inner peripheral surface of the through hole even if plating of the electrically insulating base plate is not possible.

If the electrically conductive coating is formed from an electrically conductive low-temperature baking-type coating material, it becomes possible to form the electrically conductive coating on the inner peripheral surface of the through hole even if the electrically insulating base plate is neither compatible with plating nor highly heat resistant.

While the present invention has been described with reference to what are presently considered to be preferred embodiments thereof, it is to be understood that the invention is not limited to the disclosed embodiment or constructions. To the contrary, the invention is intended to cover various modifications and equivalent arrangements included within the spirit and scope of the appended claims.

What is claimed as new and desired to be secured by Letters Patent of the United States is:

1. A multi-stage electronic cooling device comprising:
   an electrically insulating base plate;
   a first thermoelectric converter portion having the Peltier effect and disposed on one surface of the electrically insulating base plate;
   a second thermoelectric converter portion having the Peltier effect and disposed on another surface of the electrically insulating base plate;
   a through hole formed in the electrically insulating base plate; and
   an electrically conductive member interconnecting the first thermoelectric converter portion and the second thermoelectric converter portion through an interior of the through hole.

2. A multi-stage electronic cooling device according to claim 1, wherein the electrically conductive member includes an electrically conductive coating formed at least on an inner peripheral surface of the through hole.

3. A multi-stage electronic cooling device according to claim 2, wherein the electrically conductive coating is formed from one selected from the group consisting of an electrically conductive plated coating, an electrically conductive high-temperature baking-type coating material and an electrically conductive low-temperature baking-type coating material.

4. A multi-stage electronic cooling device according to claim 2, wherein the electrically conductive coating is formed from one selected from the group consisting of a copper plating, a nickel plating, a zinc plating, a silver plating, a gold plating, a high-temperature baking-type coating material containing silver and palladium as main components, a high-temperature baking-type coating material containing silver and platinum as main components, a low temperature baking-type coating material containing silver and an epoxy resin as main components, and a low-temperature baking-type coating material containing, as main components, silver and a liquid-type resin that hardens depending on temperature.

5. A multi-stage electronic cooling device according to claim 1, further comprising at least two further electrically insulating base plates disposed at opposite sides of said electrically insulating base plate, wherein the first thermoelectric converter portion and the second thermoelectric converter portion are separately sandwiched between said electrically insulating base plate and a respective one of said further electrically insulating base plates.

6. A multi-stage electronic cooling device according to claim 5, wherein each of the first thermoelectric converter portion and the second thermoelectric converter portion comprises at least one n-type thermoelectric element, at least one p-type thermoelectric element, and at least one electrode electrically interconnecting the at least one n-type thermoelectric element and the at least one p-type thermoelectric element.

7. A multi-stage electronic cooling device according to claim 6, wherein the at least one n-type thermoelectric element and the at least one p-type thermoelectric element are alternately arranged.

8. A multi-stage electronic cooling device according to claim 7, wherein the at least one electrode is fixed to one of the electrically insulating base plates, wherein both the at least one n-type thermoelectric element and the at least one p-type thermoelectric element are disposed on the at least one electrode, and wherein the at least one electrode electrically interconnects, in series, a p-type thermoelectric element and an n-type thermoelectric element adjacent thereto.

9. A multi-stage electronic cooling device according to claim 8, wherein the electrically conductive member and the at least one electrode are formed from the same material.

10. A multi-stage electronic cooling device according to claim 8, wherein the electrically conductive member electrically connects an electrode on which an n-type thermoelectric element of the first thermoelectric converter portion is disposed, to an electrode on which an n-type thermoelectric of the second thermoelectric converter portion is disposed.

11. A multi-stage electronic cooling device according to claim 10, wherein the electrodes electrically connected by the electrically conductive member are located at an end portion of the electrically insulating base plate.

12. A multi-stage electronic cooling device comprising:
    a plurality of electrically insulating base plates disposed in a layered arrangement;
    a plurality of thermoelectric converter portions having the Peltier effect and disposed between neighboring electrically insulating base plates of the plurality of electrically insulating base plates;
    a through hole formed in at least one electrically insulating base plate of the plurality of electrically insulating base plates, said at least one electrically insulating base plate carrying thermoelectric converter portions on opposite surfaces thereof, the opposite surfaces of the at least one electrically insulating base plate facing adjacent electrically insulating base plates; and
    an electrically conductive member interconnecting, through an interior of the through hole, neighboring thermoelectric converter portions disposed on the opposite surfaces of the electrically insulating base plate having the through hole.

13. A multi-stage electronic cooling device according to claim 12, wherein the electrically conductive member includes an electrically conductive coating formed at least on an inner peripheral surface of the through hole.

14. A multi-stage electronic cooling device according to claim 13,
    wherein each thermoelectric converter portion comprises at least one n-type thermoelectric element and at least one p-type thermoelectric element that are alternately arranged, and electrodes fixed to surfaces of the neighboring electrically insulating base plates that sandwich the thermoelectric converter portion, the surfaces facing the thermoelectric converter portion, and wherein the at least one n-type thermoelectric element and the at least one p-type thermoelectric element are disposed on the electrodes and are electrically interconnected in series by the electrodes.

15. A multi-stage electronic cooling device according to claim 14, wherein the electrically conductive member and the electrodes are formed from the same material.

16. A multi-stage electrically cooling device comprising:
    a first electrically insulating base plate;
    a second electrically insulating base plate;
    a third electrically insulating base plate;
    a first thermoelectric converter portion having the Peltier effect and disposed between the first electrically insulating base plate and the second electrically insulating base plate;
    a second thermoelectric converter portion having the Pettier effect and disposed between the second electrically insulating base plate and the third electrically insulating base plate;
    a through hole formed in the second electrically insulating base plate; and
    an electrically conductive member interconnecting the first thermoelectric converter portion and the second thermoelectric converter portion via an interior of the through hole.

17. A multi-stage electronic cooling device according to claim 16, wherein the electrically conductive member includes an electrically conductive coating formed at least on an inner peripheral surface of the through hole.

18. A multi-stage electronic cooling device according to claim 17,
    wherein the first thermoelectric converter portion comprises at least one n-type thermoelectric element and at least one p-type thermoelectric element that are alternately arranged, and electrodes fixed to a first thermoelectric converter portion-side surface of the first electrically insulating base plate and to a first thermoelectric converter portion-side surface of the second electrically insulating base plate,
    wherein the at least one n-type thermoelectric element and the at least one p-type thermoelectric element of the first thermoelectric converter portion are disposed on the electrodes and are electrically interconnected in series by the electrodes,
    wherein the second thermoelectric converter portion comprises at least one n-type thermoelectric element and at least one p-type thermoelectric element that are alternately arranged, and electrodes fixed to a second thermoelectric converter portion-side surface of the second electrically insulating base plate and to a second thermoelectric converter portion-side surface of the third electrically insulating base plate, and
    wherein the at least one n-type thermoelectric element and the at least one p-type thermoelectric element of the second thermoelectric converter portion are disposed on the electrodes and are electrically interconnected in series by the electrodes.

19. A multi-stage electronic cooling device according to claim 18, wherein the electrically conductive member and the electrodes are formed from the same material.

* * * * *

UNITED STATES PATENT AND TRADEMARK OFFICE
CERTIFICATE OF CORRECTION

PATENT NO. : 5,936,192

DATED : August 10, 1999

INVENTOR(S): Hitoshi TAUCHI

It is certified that an error appears in the above-identified patent and that said Letters Patent is hereby corrected as shown below:

On the title page, item [30] has been omitted. It should be:

--[30]     Foreign Application Priority Data
    Dec. 20, 1996  [JP]  Japan  .............. 8-341139--

Signed and Sealed this

Twenty-second Day of August, 2000

Attest:

Q. TODD DICKINSON

*Attesting Officer*              *Director of Patents and Trademarks*